(12) United States Patent
Upadhyay et al.

(10) Patent No.: US 12,154,627 B2
(45) Date of Patent: Nov. 26, 2024

(54) BLOCK LIST MANAGEMENT FOR WORDLINE START VOLTAGE

(71) Applicant: Intel Corporation, Santa Clara, CA (US)

(72) Inventors: Sagar Upadhyay, Folsom, CA (US); Aliasgar Madraswala, Folsom, CA (US); Pranav Chava, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 500 days.

(21) Appl. No.: 17/483,279

(22) Filed: Sep. 23, 2021

(65) Prior Publication Data

US 2023/0086751 A1    Mar. 23, 2023

(51) Int. Cl.
| | | |
|---|---|---|
| *G11C 16/10* | (2006.01) | |
| *G11C 16/08* | (2006.01) | |
| *G11C 16/16* | (2006.01) | |
| *G11C 16/28* | (2006.01) | |
| *G11C 16/30* | (2006.01) | |

(52) U.S. Cl.
CPC ............ *G11C 16/102* (2013.01); *G11C 16/08* (2013.01); *G11C 16/16* (2013.01); *G11C 16/28* (2013.01); *G11C 16/30* (2013.01)

(58) Field of Classification Search
CPC ....... G11C 16/102; G11C 16/08; G11C 16/16; G11C 16/28; G11C 16/30
See application file for complete search history.

(56) References Cited

U.S. PATENT DOCUMENTS

2021/0240635 A1*  8/2021  Wu .................. G11C 16/30

* cited by examiner

*Primary Examiner* — Alfredo Bermudez Lozada
(74) *Attorney, Agent, or Firm* — Jordan IP Law, LLC

(57) ABSTRACT

Systems, apparatuses, and methods provide for technology that stores a sampled dynamic start voltage value based on a fast to program plane. A current multi-plane program operation is received corresponding to a current cell block and wordline pair associated with a current enabled plane of a plurality of enabled planes. A block list is scanned based on the current cell block and wordline pair. The block list includes a plurality of entries including a reference start voltage corresponding to a reference cell block and wordline pair associated with a reference enabled plane. Additionally, the reference start voltage is reused as a dynamic start voltage in response to finding a match between the current cell block and wordline pair as compared to the reference cell block and wordline pair. Such a match is performed only for a least enabled plane of the plurality of enabled planes.

20 Claims, 8 Drawing Sheets

| Operation | Block Address (P0,P1,P2,P3) | ADWLSV Entry List | Comments |
|---|---|---|---|
| Quad Plane Program | 0 (fastest), 1, 2, 3 | 0 (entry w.r.t 0) | Block 0 is added into ADWLSV Entry List |
| Quad Plane Program | 2,2,137 (fastest), 98, 135 | 0, 137 (entry w.r.t 137) | Block 137 is added into ADWLSV Entry List |
| Quad Plane Program | 0, 1, 2, 3 | 0, 137 | Entry from Block 0 is re-used |
| Quad Plane Program | 4, 5, 6, 7 (fastest) | 0, 137, 7 (entry w.r.t 7) | Block 7 is added into ADWLSV Entry List |
| Quad Plane Program | 4, 5, 6, 7 | 0, 137, 7 | Entry from Block 7 is re-used |
| Quad Plane Program | 0, 137, 4, 6 |  | Since same group of block addresses are not issued as previous program operations, this is not allowed. Prior to issuing this QP program all block addresses must be removed from ADWLSV Entry List |
| Quad Plane Program | 8, 9 (fastest), 10, 11 | 0, 137, 7, 9 (entry w.r.t 9) | Block 9 is added into ADWLSV Entry List |
| Quad Plane Program | 0, 137 (fastest), 7, 9 | 0, 137, 7, 9 | Since all four blocks are available in the ADWLSV Entry List, NAND will compare the entries from all four blocks and use the minimum DSV (which in this case should be from block 137) |

FIG. 3
Prior Art

| Operation | Block Address (c0, c1, c2, c3) | ADWLSV Entry List | Comments |
|---|---|---|---|
| Quad Plane Program | 0 (fastest) 1, 2, 3 | 0 (entry w.r.t 0) | Block 0 is added into ADWLSV Entry List |
| Quad Plane Program | 212, 137 (fastest), 98, 135 | 0, 212 (entry w.r.t 137) | Block 212 is added into ADWLSV Entry List |
| Quad Plane Program | 0, 1, 2, 3 | 0, 212 | Entry from Block 0 is re-used |
| Quad Plane Program | 4, 5, 6, 7 (fastest) | 0, 212, 4 (entry w.r.t 7) | Block 4 is added into ADWLSV Entry List |
| Quad Plane Program | 4, 5, 6, 7 | 0, 212, 4 | Entry from Block 4 is re-used |
| Quad Plane Program | 0, 137, 6, 7 | | Since same group of block addresses are not issued as previous program operations, this is not allowed. Prior to issuing this QP program all block addresses must be removed from ADWLSV Entry List |
| Quad Plane Program | 8, 9 (fastest) 10, 11 | 0, 212, 4, 8 (entry w.r.t 9) | Block 8 is added into ADWLSV Entry List |
| Quad Plane Program | 0, 137 (fastest) 7, 9 | 0, 212, 4, 8 | Since same group of block addresses are not issued as previous program operations, this is not allowed. Prior to issuing this QP program all block addresses must be removed from ADWLSV Entry List |

FIG. 4

BLOCK LIST MANAGEMENT FOR WORDLINE START VOLTAGE

TECHNICAL FIELD

Embodiments generally relate to memory structures. More particularly, embodiments relate to quad-plane program blocklist management to improve performance in non-volatile memory (NVM) structures.

BACKGROUND

NAND-type flash memory ("NAND memory") may be organized into multiple cells, with each cell containing one or more bits of data and being accessible through an array of bit lines (columns) and word lines (rows). As NAND density increases, program performance needs to be improved to meet or exceed sequential write solid state drive (SSD) bandwidth. In an SSD, a program-operation is often performed in quad-plane mode. In such a quad-plane mode, each plane has one block mapped to it and the system maintains that mapping for all quad-plane operations for most of the time. Alternatively, are some applications where systems operate in dual-plane or single-plane mode and instances where systems perform block-plane revectoring for multi-plane operations.

NAND density is expected to increase for each future generation. Accordingly, program performance needs to likewise improve to meet or exceed SSD bandwidth requirements for sequential writes.

BRIEF DESCRIPTION OF THE DRAWINGS

The various advantages of the embodiments will become apparent to one skilled in the art by reading the following specification and appended claims, and by referencing the following drawings, in which:

FIG. 3 is a table of an example of a conventional quad-plane program blocklist management;

FIG. 4 is a table of an example of a quad-plane program blocklist management according to an embodiment;

DESCRIPTION OF EMBODIMENTS

As will be described in greater detail below, some implementations herein focus on quad-plane program-time improvement. For example, such a quad-plane program-time improvement is capable of being accomplished by reducing certain logic-timings during the Auto Dynamic Wordline Start Voltage (ADWLSV) Block-List Entry scanning operation. Additionally, or alternatively, some implementations herein also addresses the corner cases of block-plane revectoring by maintaining a handshake with a host system.

The Auto Dynamic Wordline Start Voltage (ADWLSV) feature is used herein to reduce typical page programming time (tPROG) by adjusting the programming start voltage. In some examples, such an adjustment to the programming start voltage is based on previous program operations issued to blocks that are in a block list of the ADWLSV. The tPROG of devices typically change during the lifetime of a device as it gets cycled. At the beginning of its life, the tPROG is longer. As the device gets cycled, the tPROG becomes shorter. To maintain a constant tPROG during its lifetime, the programming start voltage is typically adjusted over time.

In some examples, the ADWLSV block list contains up to twenty block addresses (e.g., along with the associated sampled dynamic start voltage information and the associated wordline information). For multi-plane program operations, for example, an entry is added to the ADWLSV block list if there is a slot available in the block list and if none of the multi-plane block addresses match a block address currently in the block list. In some implementations, only the block address for the fast to program block/plane in the multiplane program is added. As used herein the term "fast to program" refers to a select candidate that is fastest to program out of a group of candidates (e.g., the fastest to program plane)

In some examples, an entry is removed from the ADWLSV block list when the last page of any of the decks (e.g., three decks, etc.) on that block is programmed or when that deck on a block is erased. For example, an entry is also removed from the ADWLSV block list when a program is issued to the first logical page on a wordline. As described in greater detail below, in some implementations, ADWLSV block list management includes operations to scan through the block list and reuse an existing entry for a dynamic start voltage (DSV), and scan through the block list to remove an existing entry (if any) and store a new entry.

Figure 1:
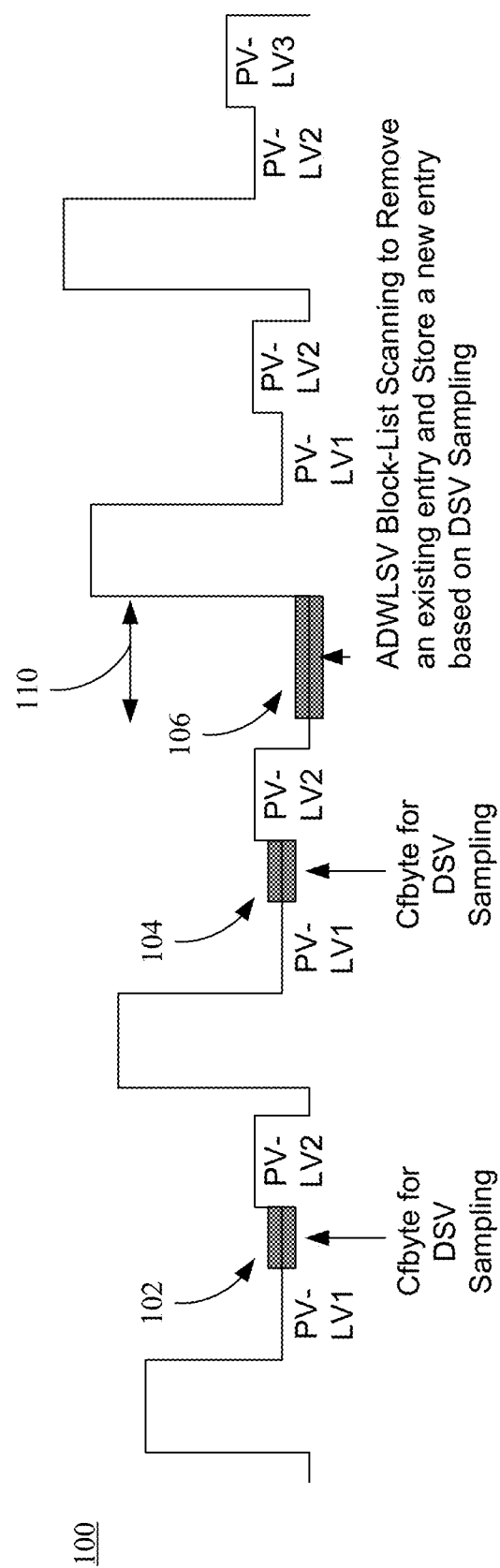
FIG. 1 is a diagram of an example of a conventional quad-plane program operation waveform for a program-verify.

Turning now to FIG. 1, a conventional quad-plane program operation waveform 100 is shown. In the illustrated example, conventional quad-plane program operation waveform 100 performs a first program-verify that passes a dynamic start voltage (DSV) sampling and a second program-verify that fails the DSV sampling.

As illustrated, the conventional quad-plane program operation waveform 100 includes a dynamic start voltage sampling 102, a dynamic start voltage sampling 104, and a block list scanning operation 106. For example, the block list scanning operation 106 removes an existing entry from the block list and stores a new entry to the block list. The removal of the existing entry and the storage of the new entry with respect to the block list is based on the dynamic start voltage sampling 102 and the dynamic start voltage sampling 104.

As will be described in greater detail below, a conventional time period 110 associated with the block list scanning operation 106 may be improved upon.

Figure 2:
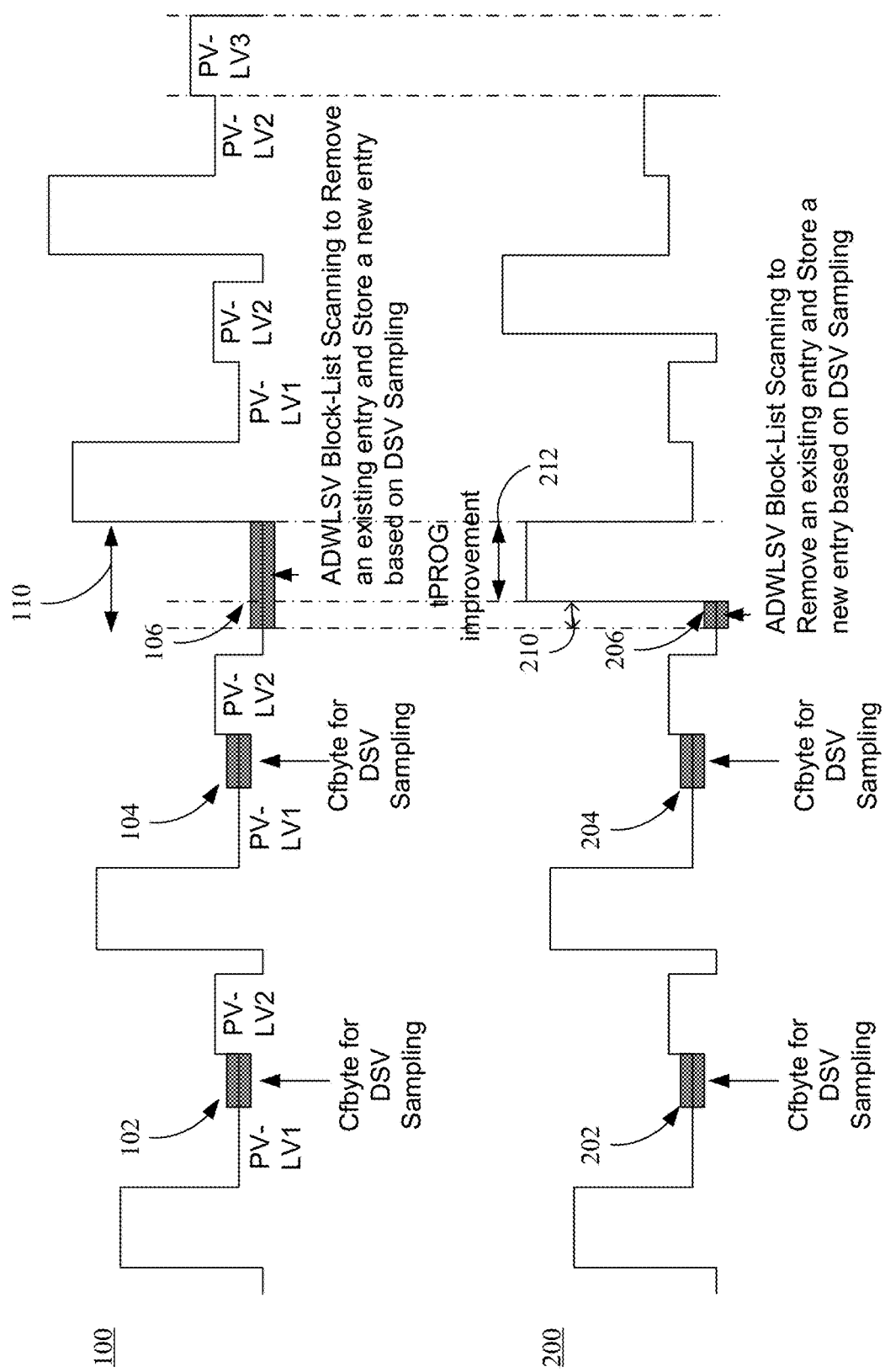
FIG. 2 is a diagram of an example of a quad-plane program operation waveform for a program-verify according to an embodiment.

Turning now to FIG. 2, a quad-plane program operation waveform 200 is shown according to an embodiment. In the illustrated example embodiment, the quad-plane program operation waveform 200 performs a first program-verify that passes a dynamic start voltage (DSV) sampling and a second program-verify that fails the DSV sampling according to implementations described herein.

As illustrated embodiment, the quad-plane program operation waveform 200 includes a dynamic start voltage sampling 202, a dynamic start voltage sampling 204, and a block list scanning operation 206. For example, the block list scanning operation 206 removes an existing entry from the block list and stores a new entry to the block list. The removal of the existing entry and the storage of the new entry with respect to the block list is based on the dynamic start voltage sampling 202 and the dynamic start voltage sampling 204 accordingly to implementations described herein.

As discussed above, the conventional time period 110 associated with the block list scanning operation 106 may be improved upon. Using implementations discussed herein, a time period 210 associated with the block list scanning operation 206 results in a typical page programming time (tPROG) improvement time period 212.

In operation, after the dynamic start voltage sampling passes, an Auto Dynamic Wordline Start Voltage (ADWLSV) block list is scanned to remove an existing entry (if any) and add the dynamic start voltage sampling value that passes the program-verify operation. The added dynamic start voltage sampling value that passes the program-verify operation includes an appropriate wordline and block identification information.

As discussed above, the Auto Dynamic Wordline Start Voltage (ADWLSV) is a feature used to reduce typical page programming time (tPROG) by dynamically adjusting the programming start voltage based on previous program operations issued to a block/wordline combination (e.g., which are in the ADWLSV block list). The ADWLSV block list may contain a number of entries (e.g., contains up to 20 entries) where each entry maintains the dynamic start voltage (DSV) information from the fast to program plane, wordline number, and the block number.

In one implementation, during a program-operation, NAND firmware scans though the ADWLSV block list to either store a new entry based on the current program-operation or to find a match that can be used for current program-operation (or that can be removed from the block list). This scanning costs a significant amount of time (e.g., about 18.5 us for a typical quad plane program operation) as scanning needs to be performed for all enabled planes across all 20 entries in the block list.

As will be described in greater detail below, implementations herein provide for technology that considers system-usage of quad-plane operations and stores a sampled dynamic start voltage value based on a fast to program plane along with a logical block address corresponding to a least enabled plane number. With such technology, a current multi-plane program operation is received that corresponds to a current cell block and wordline pair. The current cell block and wordline pair is associated with a current enabled plane of a plurality of enabled planes. A block list is scanned based on the current cell block and wordline pair. The block list includes a plurality of entries, where the plurality of entries individually include a reference start voltage corresponding to a reference cell block and wordline pair, and where the reference cell block and wordline pair is associated with a reference enabled plane of the plurality of enabled planes. Additionally, the reference start voltage is reused as a dynamic start voltage in response to finding a match between the current cell block and wordline pair as compared to the reference cell block and wordline pair during the scan of the block list. Such a match is performed only for a least enabled plane of the plurality of enabled planes.

In some implementations herein, techniques are used to efficiently maps the dynamic start voltage (DSV) information from the fast to program plane (e.g., including the wordline number and the block number of a least enabled plane number). For example, Plane0 is the least enabled plane number in a quad plane program operation. Such techniques are capable of improve the block list scanning time (e.g., by approximately 75%) contributing towards a reduce typical page programming time (tPROG) improvement for a quad plane program operation. Similarly, in other implementations there may be approximately a 1% triple-level cell (TLC) quad plane typical page programming time (tPROG) efficiency improvement, a 5.9% single-level cell (SLC) quad plane typical page programming time (tPROG) efficiency improvement for a non-cache program without a smart-prologue capability, and a 0.9% single-level cell (SLC) quad plane typical page programming time (tPROG) efficiency improvement for a cache program with a smart-prologue capability.

In operation, such a quad-plane program operation for a program-verify may be implemented in one or more memory devices. Such a memory device may include non-volatile memory and/or volatile memory. Non-volatile memory is a storage medium that does not require power to maintain the state of data stored by the medium. In one embodiment, the memory structure is a block addressable storage device, such as those based on NAND or NOR technologies. A storage device may also include future generation nonvolatile devices, such as a three-dimensional (3D) crosspoint memory device, or other byte addressable write-in-place nonvolatile memory devices. In one embodiment, the storage device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The term "storage device" may refer to the die itself and/or to a packaged memory product. In some embodiments, 3D crosspoint memory may comprise a transistor-less stackable cross point architecture in which memory cells sit at the intersection of word lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD235, JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at jedec.org). Such standards (and similar standards) may be referred to as DDR-based standards and communication interfaces of the storage devices that implement such standards may be referred to as DDR-based interfaces.

Turning now to FIG. 3, a table 300 is shown of a conventional quad-plane program blocklist management. In the illustrated example, conventional implementations of block list management store a "sampled dynamic start voltage" value based on fast to program plane along with the logical block address of that fast to program plane during that quad-plane program operation.

In an example with quad plane programming (e.g., with Plane0, Plane1, Plane2, and Plane3) where Plane2 is the fast to program plane, such conventional implementations would store a sampled dynamic start voltage based on a Plane2-Block2. In such an example, the sampled dynamic start voltage based on a Plane2-Block2 will be stored with Block2 mapping, as illustrated below:

Plane0-Block0, Plane1-Block1, Plane2-Block2 (Fast to Program), Plane3-Block3→Store DSV entry based on Plane2-Block2 with Block2 mapping While checking the block list to either reuse or remove (and add) an entry, scanning is typically performed across all entries in the block list and for each block of that quad-plane program operation. In the conventional example above, all 20 entries in the block list will be scanned for Plane0-Block0, Plane1-Block1, Plane2-Block2, and Plane3-Block3.

Additionally, in some cases the dynamic start voltage entries of more than one block-plane of a quad-plane program operation are present in the block list (e.g., referred to herein as "corner-cases"). The conventional example above deals with such corner-cases by comparing all the available entries and using the smallest entry among them. As will be described in greater detail below, such conventional operation can be improved upon.

Turning now to FIG. 4, a table 400 is shown of an example of a quad-plane program blocklist management according to an embodiment. In the illustrated example, some implementations described herein consider the system-usage of all quad-plane operations and always store the sampled dynamic start voltage value based on the fast to program plane along with a logical block address corresponding to the least enabled plane number.

In an example with quad plane programming (e.g., with Plane0, Plane1, Plane2, and Plane3) where Plane2 is the fast to program plane, such implementations described herein store a sampled dynamic start voltage based on a Plane2-Block2. In such an example, the sampled dynamic start voltage based on a Plane2-Block2 will be stored with Block0 mapping (unlike conventional implementations, which would typically utilize Block2 mapping), as illustrated below:

Plane0-Block0, Plane1-Block1, Plane2-Block2 (Fast to Program), Plane3-Block3→Store DSV entry based on Plane2-Block2 with Block0 mapping While checking an Auto Dynamic Wordline Start Voltage (ADWLSV) block list to reuse or remove (e.g., or add) an entry, scanning is performed across all 20 entries. However, scanning performed across all 20 entries and is only performed for the least enabled plane number, as illustrated below:

Scan through all 20 entries for Plane0-Block0

This operation is facilitated by the earlier operation of using the mapping of Block0 to store the sampled dynamic start voltage (unlike conventional implementations, which would typically utilize Block2 mapping in the example above). As scanning of Auto Dynamic Wordline Start Voltage (ADWLSV) block list is performed across all entries for only least enabled plane number, the time for scanning is improved to contribute towards typical page programming time (tPROG) improvement.

Additionally, or alternatively, implementation herein are capable of maintaining a handshake with a host system. Such a handshake is used to selectively remove a dynamic start voltage entry manually from the Auto Dynamic Wordline Start Voltage (ADWLSV) block list. Such removal may be utilized in cases of plane-block revectoring and/or to avoid situations where entries corresponding to more than one block-plane of a quad-plane program operation are present in the Auto Dynamic Wordline Start Voltage (ADWLSV) block list.

Figure 5:
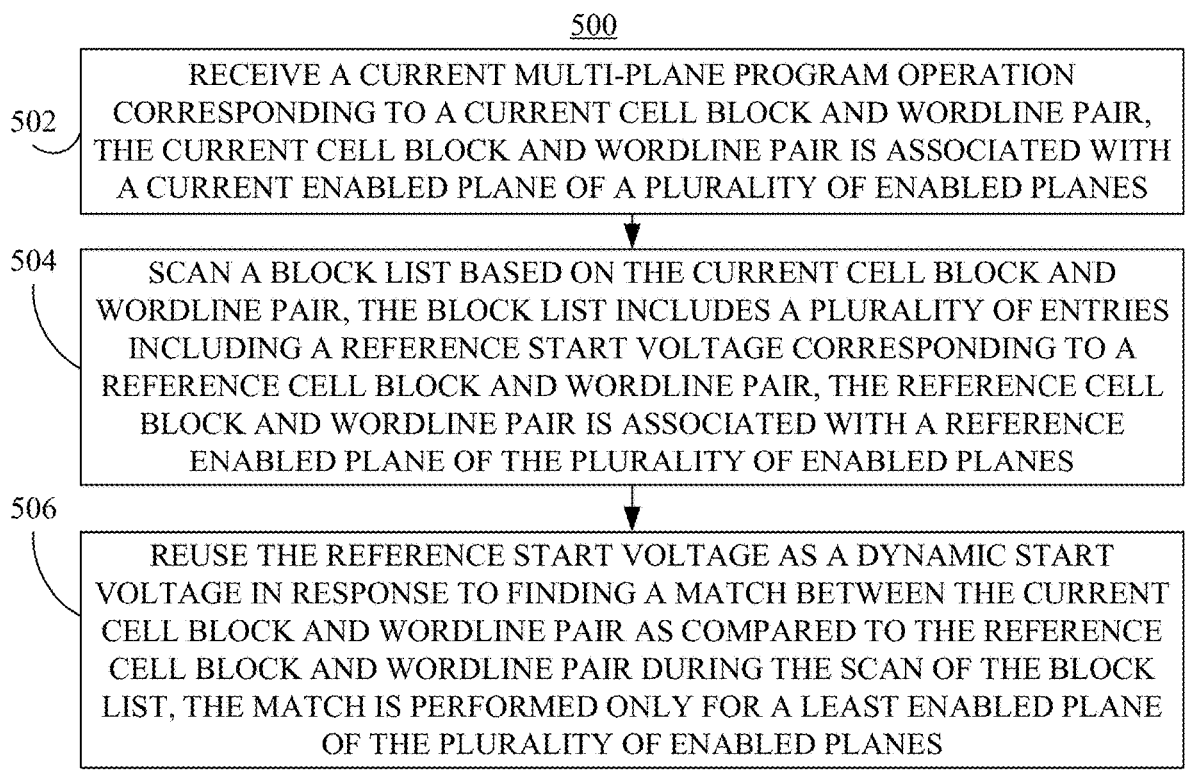
FIG. 5 is a flowchart of an example of a method for wordline start voltage blocklist management according to an embodiment.

FIG. 5 is a flowchart of an example of a method 500 of operating a performance-enhanced computing system by wordline start voltage blocklist management according to an embodiment. The method 500 may generally be implemented in a device, such as, for example, a memory device (e.g., memory device 848 of FIG. 8), a memory controller (e.g., chip controller apparatus 850 of FIG. 8), and/or the like as discussed in greater detail below. Additionally, or alternatively, the method 500 may be implemented in one or more modules as a set of logic instructions stored in a machine- or computer-readable storage medium such as random access memory (RAM), read only memory (ROM), programmable ROM (PROM), firmware, flash memory, etc., in configurable hardware such as, for example, programmable logic arrays (PLAs), field programmable gate arrays (FPGAs), complex programmable logic devices (CPLDs), in fixed-functionality hardware using circuit technology such as, for example, application specific integrated circuit (ASIC), complementary metal oxide semiconductor (CMOS) or transistor-transistor logic (TTL) technology, or any combination thereof.

Illustrated processing block 502 provides for receiving a current multi-plane program operation. For example, a current multi-plane program operation corresponding to a current cell block and wordline pair is received, where the current cell block and wordline pair is associated with a current enabled plane of a plurality of enabled planes.

Illustrated processing block 504 provides for scanning a block list based on the current cell block and wordline pair. For example, a block list is scanned based on the current cell block and wordline pair, where the block list includes a plurality of entries, where the plurality of entries individually include a reference start voltage corresponding to a reference cell block and wordline pair, and where the reference cell block and wordline pair is associated with a reference enabled plane of the plurality of enabled planes.

Illustrated processing block 506 provides for reusing the reference start voltage as a dynamic start voltage. For example, the reference start voltage is reused as a dynamic start voltage in response to finding a match between the current cell block and wordline pair and the reference cell block and wordline pair during the scan of the block list, where the match is performed only for a least enabled plane of the plurality of enabled planes.

Additional and/or alternative operations for method 500 are described in greater detail below in the description of and FIG. 6.

Figure 6:
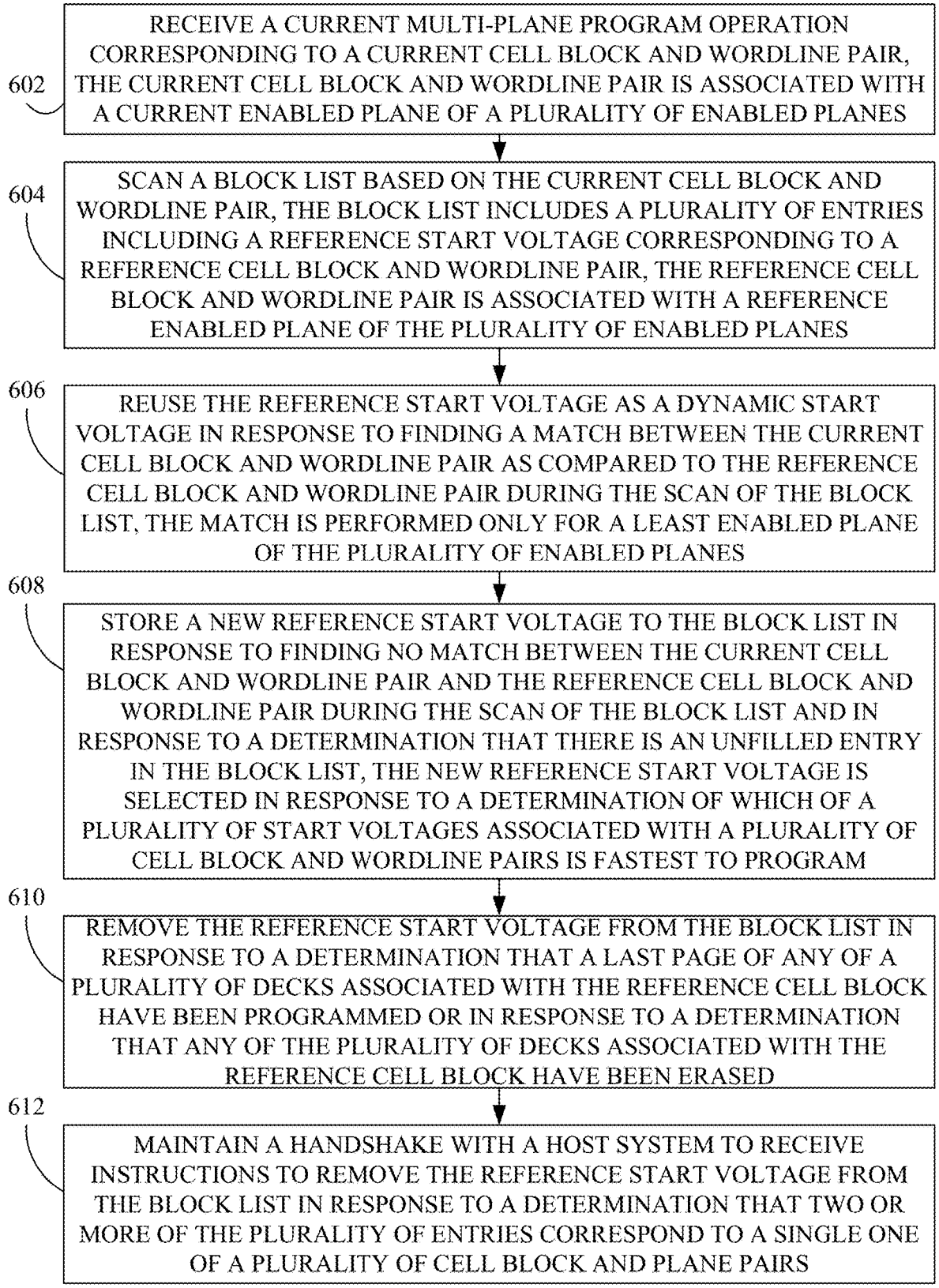
FIG. 6 is a flowchart of an example of a further method for wordline start voltage blocklist management according to an embodiment.

FIG. 6 is a flowchart of an example of a further method 600 of operating a performance-enhanced computing system by wordline start voltage blocklist management according to another embodiment. The method 600 may generally be implemented in a device, such as, for example, a memory device (e.g., memory device 848 of FIG. 8), a memory controller (e.g., chip controller apparatus 850 of FIG. 8), and/or the like as discussed in greater detail below. Additionally, or alternatively, the method 600 may be implemented in one or more modules as a set of logic instructions stored in a machine- or computer-readable storage medium such as random access memory (RAM), read only memory (ROM), programmable ROM (PROM), firmware, flash memory, etc., in configurable hardware such as, for example, programmable logic arrays (PLAs), field programmable gate arrays (FPGAs), complex programmable logic devices (CPLDs), in fixed-functionality hardware using circuit technology such as, for example, application specific integrated circuit (ASIC), complementary metal oxide semiconductor (CMOS) or transistor-transistor logic (TTL) technology, or any combination thereof.

Illustrated processing block 602 provides for receiving a current multi-plane program operation. For example, a current multi-plane program operation corresponding to a current cell block and wordline pair is received, where the current cell block and wordline pair is associated with a current enabled plane of a plurality of enabled planes.

Illustrated processing block 604 provides for scanning a block list based on the current cell block and wordline pair. For example, a block list is scanned based on the current cell block and wordline pair, where the block list includes a plurality of entries, where the plurality of entries individually include a reference start voltage corresponding to a reference cell block and wordline pair, and where the reference cell block and wordline pair is associated with a reference enabled plane of the plurality of enabled planes.

In some implementations, the scan operation is performed across all of the plurality of enabled planes and across all of the plurality of entries to the block list.

Illustrated processing block 606 provides for reusing the reference start voltage as a dynamic start voltage. For example, the reference start voltage is reused as a dynamic start voltage in response to finding a match between the current cell block and wordline pair and the reference cell block and wordline pair during the scan of the block list, where the match is performed only for a least enabled plane of the plurality of enabled planes.

In some implementations, the least enabled plane includes a plane from the plurality of enabled planes that has a lowest numerical value.

Illustrated processing block 608 provides for storing a new reference start voltage to the block list. For example, a new reference start voltage is stored to the block list in response to finding no match between the current cell block and wordline pair as compared to the reference cell block and wordline pair during the scan of the block list and in response to a determination that there is an unfilled entry in the block list.

In some implementations, the new reference start voltage is selected in response to a determination of which of a plurality of start voltages associated with a plurality of cell block and wordline pairs is fastest to program.

Illustrated processing block 610 provides for removing the reference start voltage from the block list. For example, the reference start voltage is removed from the block list in response to a determination that a last page of any of a plurality of decks associated with the reference cell block have been programmed. Additionally, or alternatively, the reference start voltage is removed from the block list in response to a determination that any of the plurality of decks associated with the reference cell block have been erased.

Additionally, or alternatively, the reference start voltage is removed from the block list in response to a determination that a reference cell block matches but the wordline doesn't match then that entry. In such an example, the existing entry is removed and a new entry which corresponds to same cell-block and new worldline is added. For example, the reference start voltage is removed from the block list in response to a determination that a program has been issued to the first logical page on a wordline.

Illustrated processing block 612 provides for maintaining a handshake with a host system. For example, a handshake with a host system is maintained to receive instructions to remove the reference start voltage from the block list in response to a determination that two or more of the plurality of entries correspond to a single one of a plurality of cell block and plane pairs.

Additional details regarding the various implementations of Method 600 are discussed below with regard to FIGS. 7 and 8.

Figure 7:
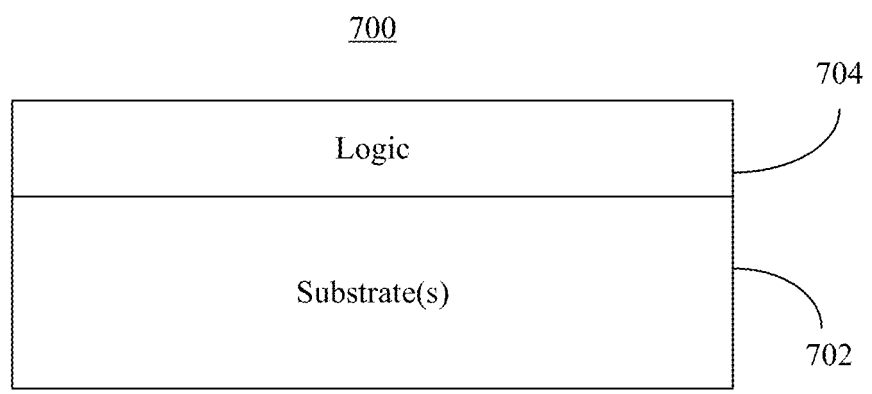
FIG. 7 is an illustration of an example of a semiconductor package apparatus according to an embodiment.

FIG. 7 shows a semiconductor apparatus 700 (e.g., chip, die, and/or package). The illustrated apparatus 700 includes one or more substrates 702 (e.g., silicon, sapphire, gallium arsenide) and logic 704 (e.g., transistor array and other integrated circuit/IC components) coupled to the substrate(s) 702. In an embodiment, the logic 704 implements one or more aspects of the method 500 (FIG. 5) and/or the method 600 (FIG. 6), already discussed.

Thus, the logic 704 is to receive a current multi-plane program operation corresponding to a current cell block and wordline pair, where the current cell block and wordline pair is associated with a current enabled plane of a plurality of enabled planes. The logic 704 scans a block list based on the current cell block and wordline pair, where the block list includes a plurality of entries, where the plurality of entries individually include a reference start voltage corresponding to a reference cell block and wordline pair, and where the reference cell block and wordline pair is associated with a reference enabled plane of the plurality of enabled planes. Additionally, the logic 704 reuses the reference start voltage as a dynamic start voltage in response to finding a match between the current cell block and wordline pair and the reference cell block and wordline pair during the scan of the block list, where the match is performed only for a least enabled plane of the plurality of enabled planes.

In one example, the logic 704 includes transistor channel regions that are positioned (e.g., embedded) within the substrate(s) 702. Thus, the interface between the logic 704 and the substrate 702 may not be an abrupt junction. The logic 704 may also be considered to include an epitaxial layer that is grown on an initial wafer of the substrate 702.

Figure 8:
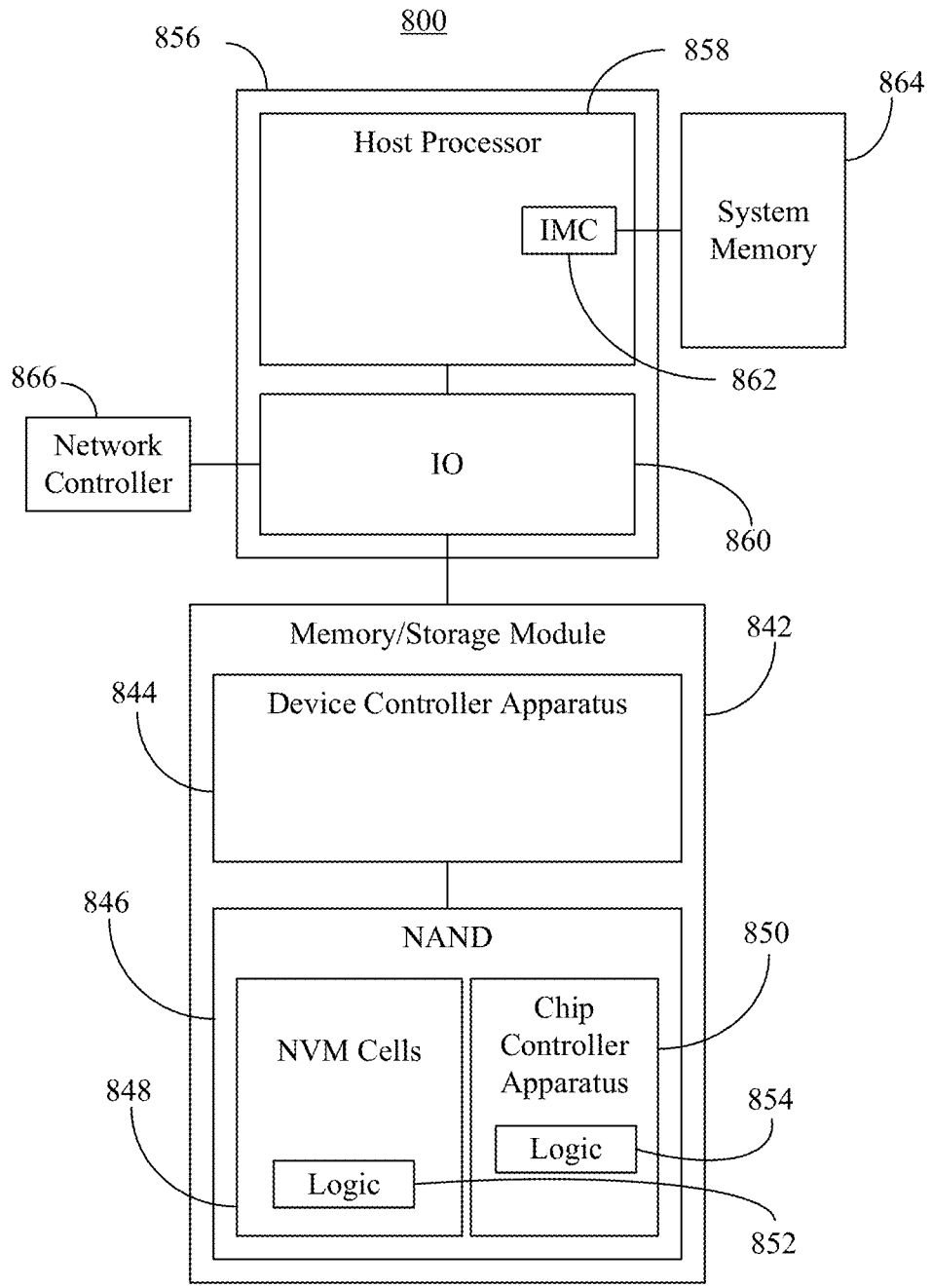
FIG. 8 is a block diagram of an example of a performance-enhanced computing system according to an embodiment.

Turning now to FIG. 8, a performance-enhanced computing system 840 is shown. In the illustrated example, a solid state drive (SSD) 842 includes a device controller apparatus 844 that is coupled to a NAND 846. The illustrated NAND 846 includes a memory device 848 having a set of multi-level NVM cells and logic 852 (e.g., transistor array and other integrated circuit/IC components coupled to one or more substrates containing silicon, sapphire, and/or gallium arsenide), and a chip controller apparatus 850 that includes logic 854. The logic 854, which may include one or more of configurable or fixed-functionality hardware, may be configured to perform one or more aspects of the method 500 (FIG. 5) and/or the method 600 (FIG. 6), already discussed.

Thus, the logic 852 is to receive a current multi-plane program operation corresponding to a current cell block and wordline pair, where the current cell block and wordline pair is associated with a current enabled plane of a plurality of enabled planes. The logic 852 scans a block list based on the current cell block and wordline pair, where the block list includes a plurality of entries, where the plurality of entries individually include a reference start voltage corresponding to a reference cell block and wordline pair, and where the reference cell block and wordline pair is associated with a reference enabled plane of the plurality of enabled planes. Additionally, the logic 852 reuses the reference start voltage as a dynamic start voltage in response to finding a match between the current cell block and wordline pair and the reference cell block and wordline pair during the scan of the block list, where the match is performed only for a least enabled plane of the plurality of enabled planes.

In one example, NAND 846 includes a memory array having a plurality of cell blocks (e.g., NVM cells and logic 852). In such an example, a memory controller (e.g., chip controller apparatus 850) is coupled to the memory array.

The illustrated system 840 also includes a system on chip (SoC) 856 having a host processor 858 (e.g., central processing unit/CPU) and an input/output (I/O) module 860. The host processor 858 may include an integrated memory controller 862 (IMC) that communicates with system memory 864 (e.g., RAM dual inline memory modules/DIMMs). The illustrated IO module 860 is coupled to the SSD 842 as well as other system components such as a network controller 866.

ADDITIONAL NOTES AND EXAMPLES

Example 1 includes a semiconductor apparatus including one or more substrates and logic coupled to the one or more substrates. The logic is implemented at least partly in one or more of configurable or fixed-functionality hardware. The logic is to receive a current multi-plane program operation corresponding to a current cell block and wordline pair, where the current cell block and wordline pair is associated with a current enabled plane of a plurality of enabled planes. The logic is to scan a block list based on the current cell block and wordline pair, where the block list includes a plurality of entries, where the plurality of entries individually include a reference start voltage corresponding to a reference cell block and wordline pair, and where the reference cell block and wordline pair is associated with a reference enabled plane of the plurality of enabled planes. The logic is to reuse the reference start voltage as a dynamic start voltage in response to finding a match between the current cell block and wordline pair and the reference cell block and wordline pair during the scan of the block list, where the match is performed only for a least enabled plane of the plurality of enabled planes.

Example 2 includes the semiconductor apparatus of Example 1, where the scan operation is performed across the plurality of enabled planes and across the plurality of entries to the block list.

Example 3 includes the semiconductor apparatus of Example 1, where the least enabled plane includes a plane from the plurality of enabled planes that has a lowest numerical value.

Example 4 includes the semiconductor apparatus of Example 1, where the logic is further to store a new reference start voltage to the block list in response to finding no match between the current cell block and wordline pair and the reference cell block and wordline pair during the scan of the block list and in response to a determination that there is an unfilled entry in the block list.

Example 5 includes the semiconductor apparatus of Example 4, where the new reference start voltage is selected in response to a determination of which of a plurality of start voltages associated with a plurality of cell block and wordline pairs is fastest to program.

Example 6 includes the semiconductor apparatus of Example 1, where the logic is further to remove the reference start voltage from the block list in response to a determination that a last page of any of a plurality of decks associated with the reference cell block have been programmed or in response to a determination that any of the plurality of decks associated with the reference cell block have been erased.

Example 7 includes the semiconductor apparatus of Example 1, where the logic is further to maintain a handshake with a host system to receive instructions to remove the reference start voltage from the block list in response to a determination that two or more of the plurality of entries correspond to a single one of a plurality of cell block and plane pairs.

Example 8 includes a computing system including a memory array including a plurality of cell blocks and a memory controller coupled to the memory array. The memory is to receive a current multi-plane program operation corresponding to a current cell block and wordline pair, where the current cell block and wordline pair is associated with a current enabled plane of a plurality of enabled planes. The memory is to scan a block list based on the current cell block and wordline pair, where the block list includes a plurality of entries, where the plurality of entries individually include a reference start voltage corresponding to a reference cell block and wordline pair, and where the reference cell block and wordline pair is associated with a reference enabled plane of the plurality of enabled planes. The memory is to reuse the reference start voltage as a dynamic start voltage in response to finding a match between the current cell block and wordline pair and the reference cell block and wordline pair during the scan of the block list, where the match is performed only for a least enabled plane of the plurality of enabled planes.

Example 9 includes the computing system of Example 8, where the scan operation is performed across the plurality of enabled planes and across the plurality of entries to the block list.

Example 10 includes the computing system of Example 8, where the least enabled plane includes a plane from the plurality of enabled planes that has a lowest numerical value.

Example 11 includes the computing system of Example 8, where the memory is further to store a new reference start voltage to the block list in response to finding no match between the current cell block and wordline pair and the reference cell block and wordline pair during the scan of the block list and in response to a determination that there is an unfilled entry in the block list.

Example 12 includes the computing system of Example 11, where the new reference start voltage is selected in response to a determination of which of a plurality of start voltages associated with a plurality of cell block and wordline pairs is fastest to program.

Example 13 includes the computing system of Example 8, where the memory is further to remove the reference start voltage from the block list in response to a determination that a last page of any of a plurality of decks associated with the reference cell block have been programmed or in response to a determination that any of the plurality of decks associated with the reference cell block have been erased.

Example 14 includes the computing system of Example 8, where the memory is further to maintain a handshake with a host system to receive instructions to remove the reference start voltage from the block list in response to a determination that two or more of the plurality of entries correspond to a single one of a plurality of cell block and plane pairs.

Example 15 includes at least one computer readable medium, including a set of instructions, which when executed by a computing device, cause the computing device to: receive a current multi-plane program operation corresponding to a current cell block and wordline pair, where the current cell block and wordline pair is associated with a current enabled plane of a plurality of enabled planes; scan a block list based on the current cell block and wordline pair, where the block list includes a plurality of entries, where the plurality of entries individually include a reference start voltage corresponding to a reference cell block and wordline pair, and where the reference cell block and wordline pair is associated with a reference enabled plane of the plurality of enabled planes; and reuse the reference start voltage as a dynamic start voltage in response to finding a match between the current cell block and wordline pair and the reference cell block and wordline pair during the scan of the block list, where the match is performed only for a least enabled plane of the plurality of enabled planes.

Example 16 includes the at least one computer readable medium of Example 15, where the scan operation is performed across the plurality of enabled planes and across the plurality of entries to the block list.

Example 17 includes the at least one computer readable medium of Example 15, where the least enabled plane includes a plane from the plurality of enabled planes that has a lowest numerical value.

Example 18 includes the at least one computer readable medium of Example 15, where the set of instructions, which when executed by the computing device, cause the computing device further to: store a new reference start voltage to the block list in response to finding no match between the current cell block and wordline pair and the reference cell block and wordline pair during the scan of the block list and in response to a determination that there is an unfilled entry in the block list, where the new reference start voltage is selected in response to a determination of which of a plurality of start voltages associated with a plurality of cell block and wordline pairs is fastest to program.

Example 19 includes the at least one computer readable medium of Example 15, where the set of instructions, which when executed by the computing device, cause the computing device further to remove the reference start voltage from the block list in response to a determination that a last page of any of a plurality of decks associated with the reference cell block have been programmed or in response to a determination that any of the plurality of decks associated with the reference cell block have been erased.

Example 20 includes the at least one computer readable medium of Example 15, where the set of instructions, which when executed by the computing device, cause the computing device further to maintain a handshake with a host system to receive instructions to remove the reference start voltage from the block list in response to a determination that two or more of the plurality of entries correspond to a single one of a plurality of cell block and plane pairs.

Example 21 includes a method including: receiving a current multi-plane program operation corresponding to a current cell block and wordline pair, where the current cell block and wordline pair is associated with a current enabled plane of a plurality of enabled planes; scanning a block list based on the current cell block and wordline pair, where the block list includes a plurality of entries, where the plurality of entries individually include a reference start voltage corresponding to a reference cell block and wordline pair, and where the reference cell block and wordline pair is associated with a reference enabled plane of the plurality of enabled planes; and reusing the reference start voltage as a dynamic start voltage in response to finding a match between the current cell block and wordline pair and the reference cell block and wordline pair during the scan of the block list, where the match is performed only for a least enabled plane of the plurality of enabled planes.

Example 22 includes the method of Example 21, where the scan operation is performed across the plurality of enabled planes and across the plurality of entries to the block list.

Example 23 includes the method of Example 21, where the least enabled plane includes a plane from the plurality of enabled planes that has a lowest numerical value.

Example 24 includes the method of Example 21, where the method further includes storing a new reference start voltage to the block list in response to finding no match between the current cell block and wordline pair and the reference cell block and wordline pair during the scan of the block list and in response to a determination that there is an unfilled entry in the block list, where the new reference start voltage is selected in response to a determination of which of a plurality of start voltages associated with a plurality of cell block and wordline pairs is fastest to program.

Example 25 includes the method of Example 21, where the method further includes removing the reference start voltage from the block list in response to a determination that a last page of any of a plurality of decks associated with the reference cell block have been programmed or in response to a determination that any of the plurality of decks associated with the reference cell block have been erased.

Example 26 includes the method of Example 21, where the method further includes maintaining a handshake with a host system to receive instructions to remove the reference start voltage from the block list in response to a determination that two or more of the plurality of entries correspond to a single one of a plurality of cell block and plane pairs.

Example 27 includes an apparatus comprising means for performing the method of any one of Examples 21 to 26.

Example 28 includes a machine-readable storage comprising machine-readable instructions which, when executed, implement the method of any one of Examples 21 to 26.

Technology described herein therefore provides the capability to consider the system-usage of all quad-plane operations and store the sampled dynamic start voltage value based on the fast to program plane along with a logical block address corresponding to the least enabled plane number. Advantageously, the technology improves performance by effectively saving programming time (tPROG) as compared to existing program operations. For example, such techniques are capable of improve the block list scanning time (e.g., by approximately 75%) contributing towards a reduce typical page programming time (tPROG) improvement for a quad plane program operation. Similarly, in other implementations there may be approximately a 1% triple-level cell (TLC) quad plane typical page programming time (tPROG) efficiency improvement, a 5.9% single-level cell (SLC) quad plane typical page programming time (tPROG) efficiency improvement for a non-cache program without a smart-prologue capability, and a 0.9% single-level cell (SLC) quad plane typical page programming time (tPROG) efficiency improvement for a cache program with a smart-prologue capability.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A semiconductor apparatus comprising:
   one or more substrates; and
   logic coupled to the one or more substrates, wherein the logic is implemented at least partly in one or more of configurable or fixed-functionality hardware, the logic to:
      receive a current multi-plane program operation corresponding to a current cell block and wordline pair, wherein the current cell block and wordline pair is associated with a current enabled plane of a plurality of enabled planes,
      scan a block list based on the current cell block and wordline pair, wherein the block list includes a plurality of entries, wherein the plurality of entries individually include a reference start voltage corresponding to a reference cell block and wordline pair, and wherein the reference cell block and wordline pair is associated with a reference enabled plane of the plurality of enabled planes, and
      reuse the reference start voltage as a dynamic start voltage in response to finding a match between the current cell block and wordline pair and the reference cell block and wordline pair during the scan of the block list, wherein the match is performed only for a least enabled plane of the plurality of enabled planes.

2. The semiconductor apparatus of claim 1, wherein the scan operation is performed across the plurality of enabled planes and across the plurality of entries to the block list.

3. The semiconductor apparatus of claim 1, wherein the least enabled plane comprises a plane from the plurality of enabled planes that has a lowest numerical value.

4. The semiconductor apparatus of claim 1, wherein the logic is further to:
   store a new reference start voltage to the block list in response to finding no match between the current cell block and wordline pair and the reference cell block and wordline pair during the scan of the block list and in response to a determination that there is an unfilled entry in the block list.

5. The semiconductor apparatus of claim 4, wherein the new reference start voltage is selected in response to a determination of which of a plurality of start voltages associated with a plurality of cell block and wordline pairs is fastest to program.

6. The semiconductor apparatus of claim 1, wherein the logic is further to:
   remove the reference start voltage from the block list in response to a determination that a last page of any of a plurality of decks associated with the reference cell block have been programmed or in response to a determination that any of the plurality of decks associated with the reference cell block have been erased.

7. The semiconductor apparatus of claim 1, wherein the logic is further to:

maintain a handshake with a host system to receive instructions to remove the reference start voltage from the block list in response to a determination that two or more of the plurality of entries correspond to a single one of a plurality of cell block and plane pairs.

8. A computing system comprising:

a memory array including a plurality of cell blocks; and
a memory controller coupled to the memory array, the memory to:

receive a current multi-plane program operation corresponding to a current cell block and wordline pair, wherein the current cell block and wordline pair is associated with a current enabled plane of a plurality of enabled planes, scan a block list based on the current cell block and wordline pair, wherein the block list includes a plurality of entries, wherein the plurality of entries individually include a reference start voltage corresponding to a reference cell block and wordline pair, and wherein the reference cell block and wordline pair is associated with a reference enabled plane of the plurality of enabled planes, and reuse the reference start voltage as a dynamic start voltage in response to finding a match between the current cell block and wordline pair and the reference cell block and wordline pair during the scan of the block list, wherein the match is performed only for a least enabled plane of the plurality of enabled planes.

9. The computing system of claim 8, wherein the scan operation is performed across the plurality of enabled planes and across the plurality of entries to the block list.

10. The computing system of claim 8, wherein the least enabled plane comprises a plane from the plurality of enabled planes that has a lowest numerical value.

11. The computing system of claim 8, wherein the memory is further to:

store a new reference start voltage to the block list in response to finding no match between the current cell block and wordline pair and the reference cell block and wordline pair during the scan of the block list and in response to a determination that there is an unfilled entry in the block list.

12. The computing system of claim 11, wherein the new reference start voltage is selected in response to a determination of which of a plurality of start voltages associated with a plurality of cell block and wordline pairs is fastest to program.

13. The computing system of claim 8, wherein the memory is further to:

remove the reference start voltage from the block list in response to a determination that a last page of any of a plurality of decks associated with the reference cell block have been programmed or in response to a determination that any of the plurality of decks associated with the reference cell block have been erased.

14. The computing system of claim 8, wherein the memory is further to:

maintain a handshake with a host system to receive instructions to remove the reference start voltage from the block list in response to a determination that two or more of the plurality of entries correspond to a single one of a plurality of cell block and plane pairs.

15. At least one computer readable medium, comprising a set of instructions, which when executed by a computing device, cause the computing device to:

receive a current multi-plane program operation corresponding to a current cell block and wordline pair, wherein the current cell block and wordline pair is associated with a current enabled plane of a plurality of enabled planes;

scan a block list based on the current cell block and wordline pair, wherein the block list includes a plurality of entries, wherein the plurality of entries individually include a reference start voltage corresponding to a reference cell block and wordline pair, and wherein the reference cell block and wordline pair is associated with a reference enabled plane of the plurality of enabled planes; and reuse the reference start voltage as a dynamic start voltage in response to finding a match between the current cell block and wordline pair and the reference cell block and wordline pair during the scan of the block list, wherein the match is performed only for a least enabled plane of the plurality of enabled planes.

16. The at least one computer readable medium of claim 15, wherein the scan operation is performed across the plurality of enabled planes and across the plurality of entries to the block list.

17. The at least one computer readable medium of claim 15, wherein the least enabled plane comprises a plane from the plurality of enabled planes that has a lowest numerical value.

18. The at least one computer readable medium of claim 15, wherein the set of instructions, which when executed by the computing device, cause the computing device further to:

store a new reference start voltage to the block list in response to finding no match between the current cell block and wordline pair and the reference cell block and wordline pair during the scan of the block list and in response to a determination that there is an unfilled entry in the block list, wherein the new reference start voltage is selected in response to a determination of which of a plurality of start voltages associated with a plurality of cell block and wordline pairs is fastest to program.

19. The at least one computer readable medium of claim 15, wherein the set of instructions, which when executed by the computing device, cause the computing device further to:

remove the reference start voltage from the block list in response to a determination that a last page of any of a plurality of decks associated with the reference cell block have been programmed or in response to a determination that any of the plurality of decks associated with the reference cell block have been erased.

20. The at least one computer readable medium of claim 15, wherein the set of instructions, which when executed by the computing device, cause the computing device further to:

maintain a handshake with a host system to receive instructions to remove the reference start voltage from the block list in response to a determination that two or more of the plurality of entries correspond to a single one of a plurality of cell block and plane pairs.

* * * * *